(12) United States Patent
Chan et al.

(10) Patent No.: US 10,978,335 B2
(45) Date of Patent: Apr. 13, 2021

(54) METHOD FOR PRODUCING A GATE CUT STRUCTURE ON AN ARRAY OF SEMICONDUCTOR FINS

(71) Applicant: IMEC VZW, Leuven (BE)

(72) Inventors: Boon Teik Chan, Leuven (BE); Efrain Altamirano Sanchez, Kessel-Lo (BE); Ryan Ryoung han Kim, Bertem (BE)

(73) Assignee: IMEC vzw, Leuven (BE)

( * ) Notice: Subject to any disclaimer, the term of this patent is extended or adjusted under 35 U.S.C. 154(b) by 9 days.

(21) Appl. No.: 16/563,747

(22) Filed: Sep. 6, 2019

(65) Prior Publication Data

US 2020/0083090 A1 Mar. 12, 2020

(30) Foreign Application Priority Data

Sep. 7, 2018 (EP) ..................................... 18193273

(51) Int. Cl.
| | |
|---|---|
| *H01L 21/762* | (2006.01) |
| *H01L 29/66* | (2006.01) |
| *H01L 21/763* | (2006.01) |
| *H01L 21/033* | (2006.01) |
| *H01L 29/78* | (2006.01) |

(52) U.S. Cl.
CPC .... *H01L 21/76224* (2013.01); *H01L 21/0332* (2013.01); *H01L 21/763* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | |
|---|---|---|
| 9,601,492 B1 | 3/2017 | Deng et al. |
| 9,799,769 B2 | 10/2017 | Lin |
| 9,831,306 B2 | 11/2017 | Webb et al. |
| 9,960,077 B1 | 5/2018 | Zang et al. |
| 2014/0315371 A1 | 10/2014 | Cai et al. |
| 2016/0056181 A1 | 2/2016 | Anderson et al. |
| 2016/0233298 A1 | 8/2016 | Webb et al. |
| 2019/0013245 A1* | 1/2019 | J Ha ................... H01L 21/0217 |

OTHER PUBLICATIONS

European Search Report, European Patent Application No. 18193273. 2, dated Feb. 27, 2019, 5 pages.

* cited by examiner

*Primary Examiner* — Robert K Carpenter
(74) *Attorney, Agent, or Firm* — McDonnell Boehen Hulbert & Berghoff LLP

(57) ABSTRACT

A substrate includes on its surface an array of dual stack semiconductor fins, each fin comprising a monocrystalline first portion, a polycrystalline second portion, and a mask third portion. Trenches between the fins are filled with shallow trench isolation (STI) oxide and with polycrystalline material, after which the surface is planarized. Then a second mask is produced on the planarized surface, the second mask defining at least one opening, each defined opening extending across an exposed fin. A thermal oxidation is performed of the polycrystalline material on either side of the exposed fin in each defined opening, thereby producing two oxide strips in each defined opening. Using the second mask and the oxide strips as a mask for self-aligned etching, the material of the exposed dual stack fins is removed and subsequently replaced by an electrically isolating material, thereby creating gate cut structures.

20 Claims, 8 Drawing Sheets

METHOD FOR PRODUCING A GATE CUT STRUCTURE ON AN ARRAY OF SEMICONDUCTOR FINS

CROSS-REFERENCE TO RELATED APPLICATION

The present application is a non-provisional patent application claiming priority to European Patent Application No. 18193273.2 filed Sep. 7, 2018, the contents of which are hereby incorporated by reference.

TECHNICAL FIELD

The present disclosure is related to semiconductor processing, in particular to finFET processing and the aspect of isolating neighboring gate electrodes on a dense array of fin structures.

BACKGROUND

The design rules for scaling fin-based semiconductor devices continue to evolve towards smaller dimensions. This evolution poses important challenges on the processing of these devices. One aspect that has demanded particular attention is the isolation of adjacent gate electrodes extending transversally across an array of semiconductor fins. The realization of so-called gate cut isolating structures has become more critical as the dimensions of the fins decreases, to the point where classic lithographic techniques are no longer suitable, due to overlay-related inaccuracies in terms of the position of the isolating structures.

In order to meet these strict constraints, efforts have been made to realize the gate cut structures without the need for lithographic patterning. U.S. Patent App. Pub. No. 2016/0233298 describes a method for producing self-aligned gate cut and local interconnect structures. The method involves the production of dummy spacers on both sides of the fins of an array of parallel fins, followed by the deposition of an isolation structure in the space between two dummy spacers. This method requires the step of removing fins from an array of fins, prior to the formation of the spacers. The method further requires careful attention to controlling the thickness of the spacers, in order to obtain given dimensions of the isolation structures. This approach is therefore complex in terms of process steps and control.

U.S. Pat. No. 9,960,077 describes a method wherein a self-aligned lithographic process is used for at least partially removing one fin from an array of fins, followed by the replacement of the fin by an isolating structure. The method is applied to an array of silicon fins of standard height. The method, however, involves a number of planarization steps which are incompatible with this standard fin height. In other words, the method is difficult to realize in practice without reducing the fin height.

SUMMARY

The present disclosure aims to provide a method that remedies the above-described deficiencies. This aim is achieved by the method according to the appended claims. The method is performed on a substrate comprising on its surface an array of dual stack semiconductor fins, each fin comprising a monocrystalline base portion, a polycrystalline portion, and a mask portion. The trenches between the fins are filled with shallow trench isolation (STD oxide and with polycrystalline material, after which the surface is planarized. Then a second mask is produced on the planarized surface, the second mask defining at least one opening, each opening being located across an exposed fin, and a thermal oxidation is performed of the polycrystalline material on either side of the exposed fin in each of the openings, thereby obtaining two oxide strips adjacent the exposed fin. Using the second mask and the strips as a mask for self-aligned etching, the material of the exposed dual stack fins is removed, and subsequently replaced by an electrically isolating material, thereby creating isolating gate cut structures.

The present disclosure is, in particular; related to a method for producing a gate cut structure on an array of semiconductor fins, the method comprising the steps of: (i) providing a substrate comprising an array of dual stack fins, each fin comprising: a base portion consisting of monocrystalline semiconductor material, a portion consisting of a polycrystalline semiconductor material on the monocrystalline portion, and a portion of a first mask on the polycrystalline portion; (ii) depositing a shallow trench isolation dielectric material in between and on top of the dual stack fins, and planarizing the STI material, stopping on the first mask portions of the dual stack fins; (iii) etching back the STI material beyond the top surface of the monocrystalline portions of the dual stack fins, to thereby form trenches between the dual stack tins, the trenches having the STI material on the bottom thereof; (iv) depositing a conformal dielectric layer on the dual stack fins and on the bottom of the trenches; followed by (v) depositing the polycrystalline semiconductor material in the trenches and on top of the dual stack fins to form a layer of the polycrystalline material, and planarizing the layer; stopping on the first mask portions of the dual stack fins; followed by (vi) producing a second mask on the planarized surface, the second mask defining at least one opening that exposes a dual stack fin and that extends parallel to the exposed dual stack fin, the opening having a width (w) that exceeds the width ($w_f$) of the exposed dual stack fin, and that fully overlaps the width of the exposed dual stack fin; (vii) heating the substrate thereby forming two oxide strips formed of thermally oxidized polycrystalline semiconductor material at the bottom of the at least one opening, the strips being positioned on either side of the first mask portion of the exposed dual stack fin; followed by (viii) removing the first mask portion, the polycrystalline portion; and at least part of the monocrystalline portion of the exposed dual stack fin, by a self-aligned etching process in the opening, thereby creating a trench; and (ix) filling the trench with an electrically isolating material, thereby forming the gate cut structure.

The dual stack fins may further comprise a dielectric portion in between the monocrystalline portion and the polycrystalline portion, wherein the dielectric portion is equally removed when creating the trench.

In an example embodiment, the semiconductor material is silicon and the polycrystalline semiconductor material is polycrystalline silicon.

The first mask portion on top of the polycrystalline portion of the dual stack fins may be formed of $Si_3N_4$. The second mask may be formed of an oxide material.

In an example embodiment, the semiconductor material is silicon, the polycrystalline material is polysilicon, and the second mask is formed of silicon oxide.

The present disclosure is further related to a semiconductor substrate comprising on its surface: (i) an array of dual stack fins, each fin comprising: a base portion consisting of monocrystalline semiconductor material, a portion consisting of a polycrystalline semiconductor material on the monocrystalline portion, and a portion of a first mask on the polycrystalline portion; (ii) trenches in between the dual stack fins, the trenches having a shallow trench isolation material at the bottom of the trenches, a conformal dielectric layer on the sidewalls and on the STI material at the bottom of the trenches, and a polycrystalline semiconductor material inside the trenches, and wherein the substrate is planarized at the level of the first mask portions; (iii) a second mask on the planarized surface, the second mask defining at least one opening that exposes a dual stack fin and that extends parallel to the dual stack fin; the opening having a width (w) that exceeds the width ($w_f$) of the dual stack fin, and that fully overlaps the width of the dual stack fin; and (iv) two strips formed of an oxide of the polycrystalline semiconductor material at the bottom of the at least one opening, the strips being positioned on either side of the first mask portion of the exposed dual stack fin.

In an example embodiment of the substrate according to the present disclosure, the dual stack fins further comprise a dielectric portion in between the monocrystalline portion and the polycrystalline portion, wherein the dielectric portion is equally removed when creating the trench.

In an example embodiment of the substrate according to the present disclosure, the semiconductor material is silicon and the polycrystalline semiconductor material is polycrystalline silicon.

In an example embodiment of the substrate according to the present disclosure, the first mask portion on top of the polycrystalline portion of the dual stack fins is formed of $Si_3N_4$.

In an example embodiment of the substrate according to the present disclosure, the second mask is formed of an oxide material.

In an example embodiment of the substrate according to the present disclosure, the semiconductor material is silicon, the polycrystalline material is polysilicon, and the second mask is formed of silicon oxide.

DETAILED DESCRIPTION

Figure 1A:
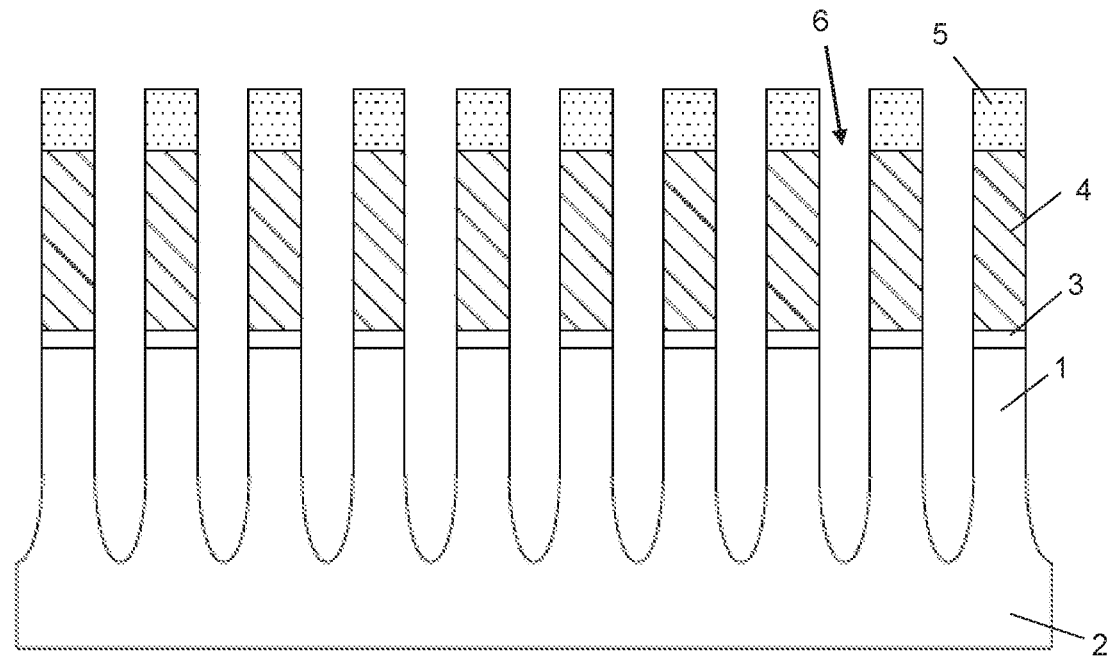
FIG. 1a illustrates a semiconductor device in a stage of a method for producing a gate cut structure on an array of semiconductor fins, according to an example embodiment.

The method of the present disclosure is applied to an array of so-called dual-stack fins, as illustrated in FIG. 1a. The dual stack fins are produced by known lithography and etch techniques applied to a monocrystalline semiconductor substrate 2. In this detailed description, substrate 2 is a monocrystalline silicon substrate but other semiconductor materials may be used in the method of the present disclosure. Substrate 2 could be a monocrystalline layer on top of another substrate. On top of each monocrystalline semiconductor portion 1 of the dual stack fins is a portion 3 of a dielectric material, which may be a layer of silicon nitrate ($Si_3N_4$). On top of the dielectric layer 3 is a portion 4 of polycrystalline silicon. The thickness of the polycrystalline Si portion 4 is of the same order as the height of the monocrystalline fin portions 1. On top of the polySi portion 4 is a mask portion 5 which may be formed of $Si_3N_4$. The mask portion 5 is originally a patterned layer produced on a blanket Si wafer comprising the layers 3 and 4, and patterned in order to be able to create the trenches 6 between the fins, by etching the material in between the strips of the mask 5. If both portions 3 and 5 are $Si_3Ni_4$, mask portion 5 may be protected during etching of layer 3. The thickness of dielectric portion 3 is in any case considerably smaller than the thickness of the mask portion 5, for example 3-4 nm for portion 3 and 40 nm for mask portion 5.

Layer 3 may also be a silicon oxide layer. In an example embodiment, the polysilicon portions 4 are directly on the upper surface of the monocrystalline fin portions 1, without any intermittent layer between the fin portions 1 and the respective polySi portions 4.

Figure 1B:
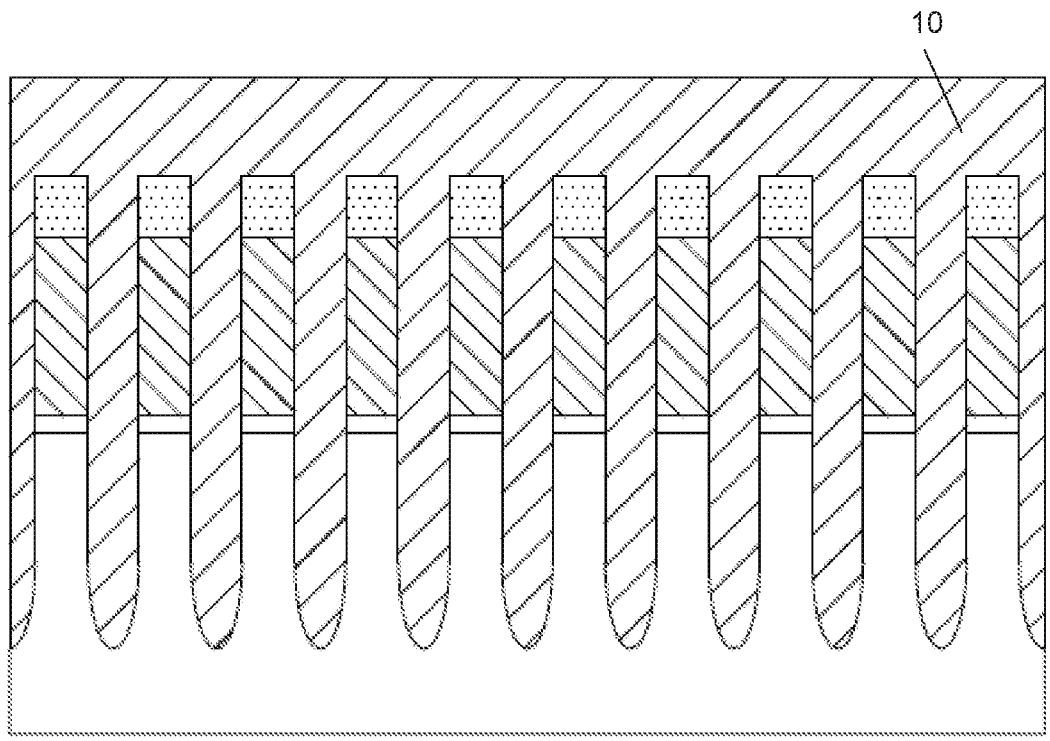
FIG. 1b illustrates the semiconductor device in another stage of the method for producing a gate cut structure on an array of semiconductor fins, according to an example embodiment.
Figure 1C:
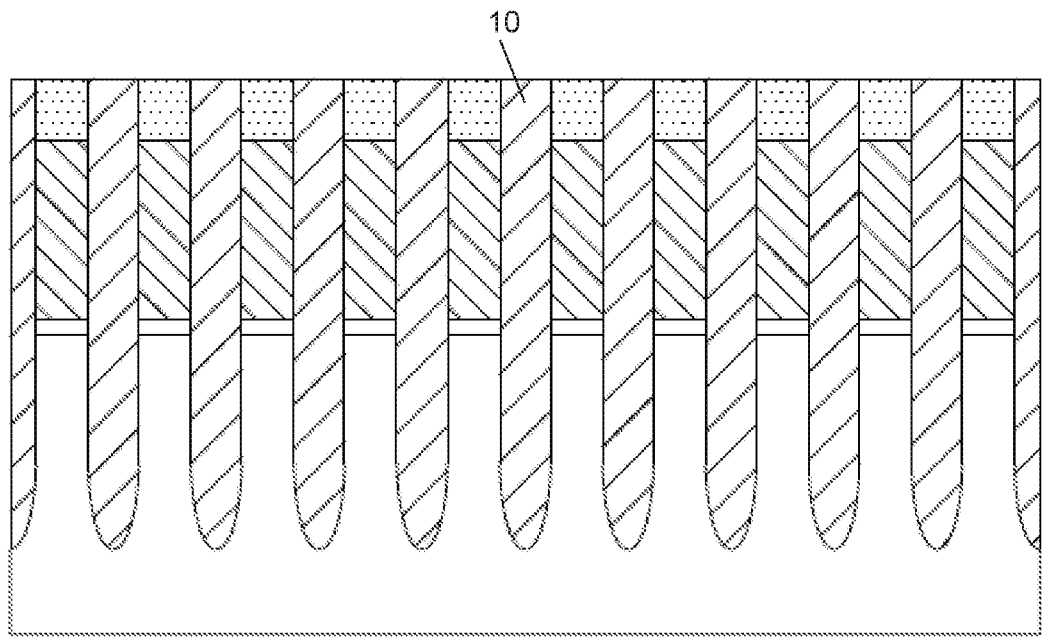
FIG. 1c illustrates the semiconductor device in another stage of the method for producing a gate cut structure on an array of semiconductor fins, according to an example embodiment.
Figure 1D:
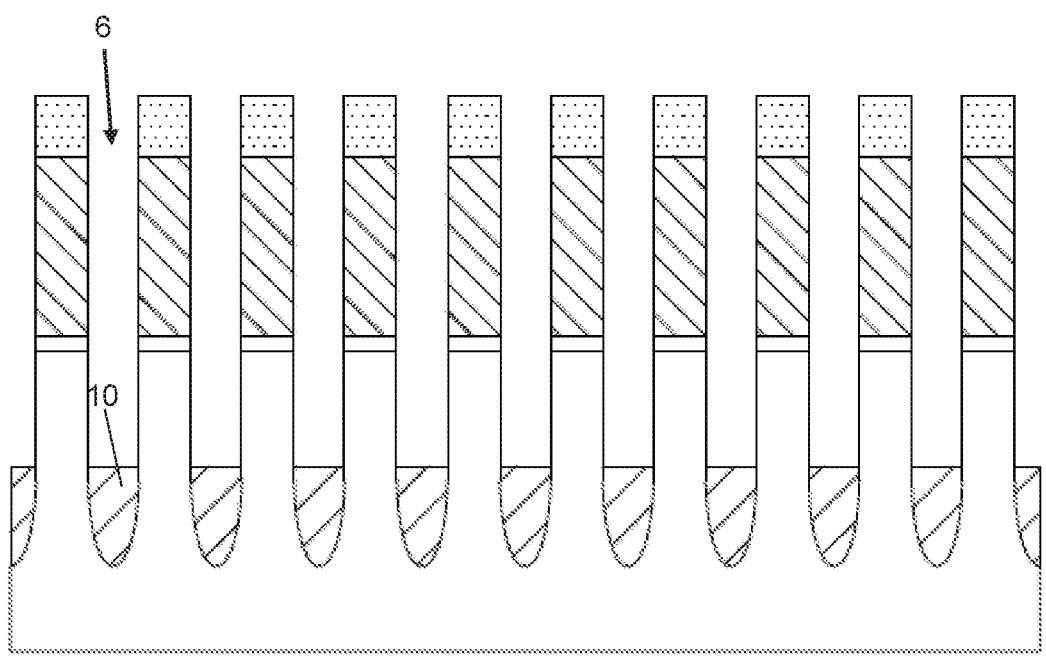
FIG. 1d illustrates the semiconductor device in another stage of the method for producing a gate cut structure on an array of semiconductor fins, according to an example embodiment.
Figure 1E:
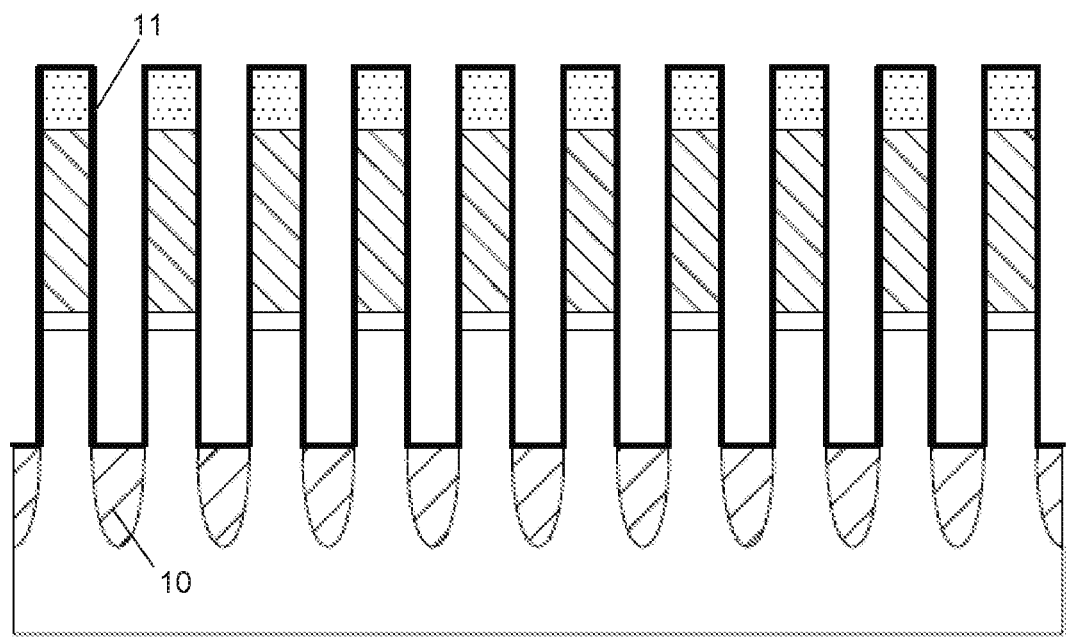
FIG. 1e illustrates the semiconductor device in another stage of the method for producing a gate cut structure on an array of semiconductor fins, according to an example embodiment.
Figure 1F:
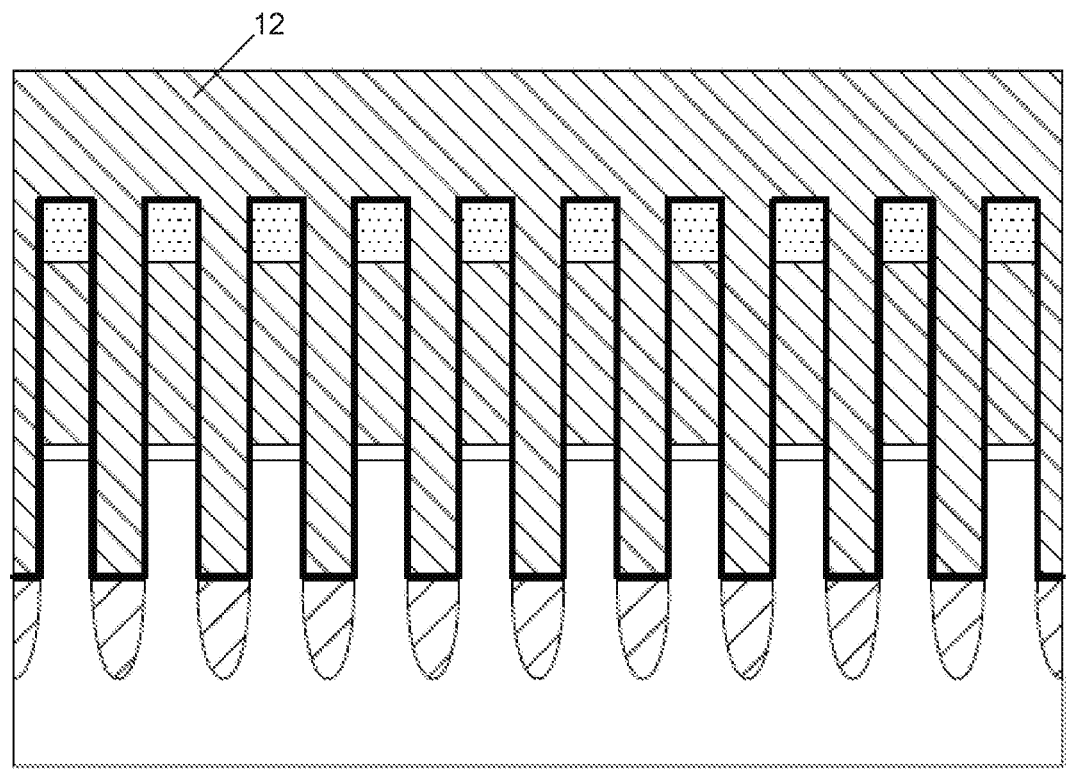
FIG. 1f illustrates the semiconductor device in another stage of the method for producing a gate cut structure on an array of semiconductor fins, according to an example embodiment.
Figure 1G:
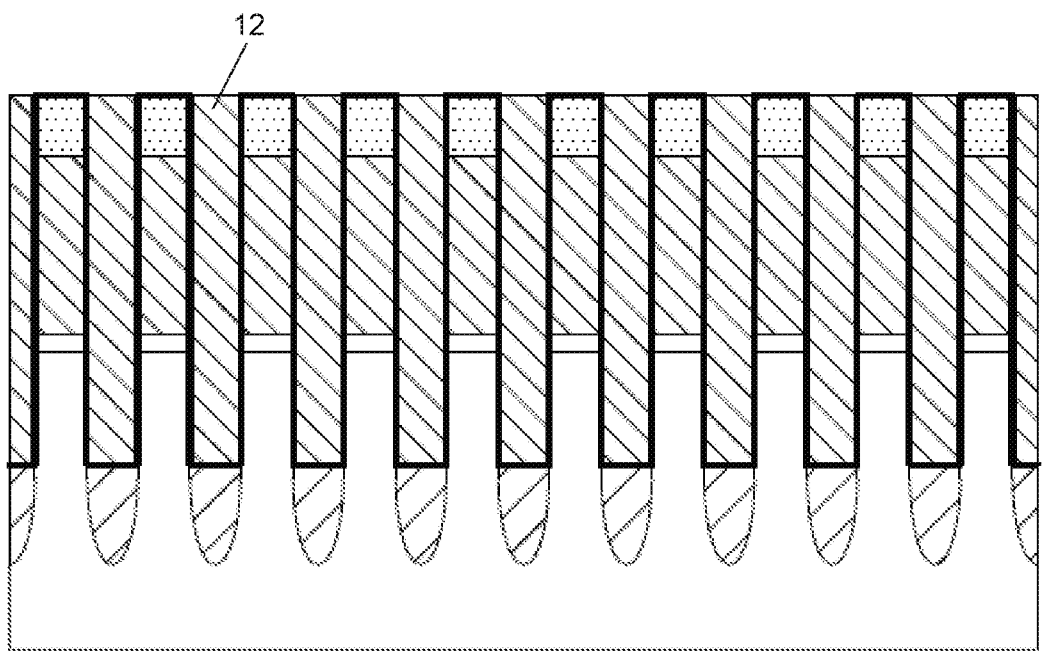
FIG. 1g illustrates the semiconductor device in another stage of the method for producing a gate cut structure on an array of semiconductor fins, according to an example embodiment.
Figure 1H:
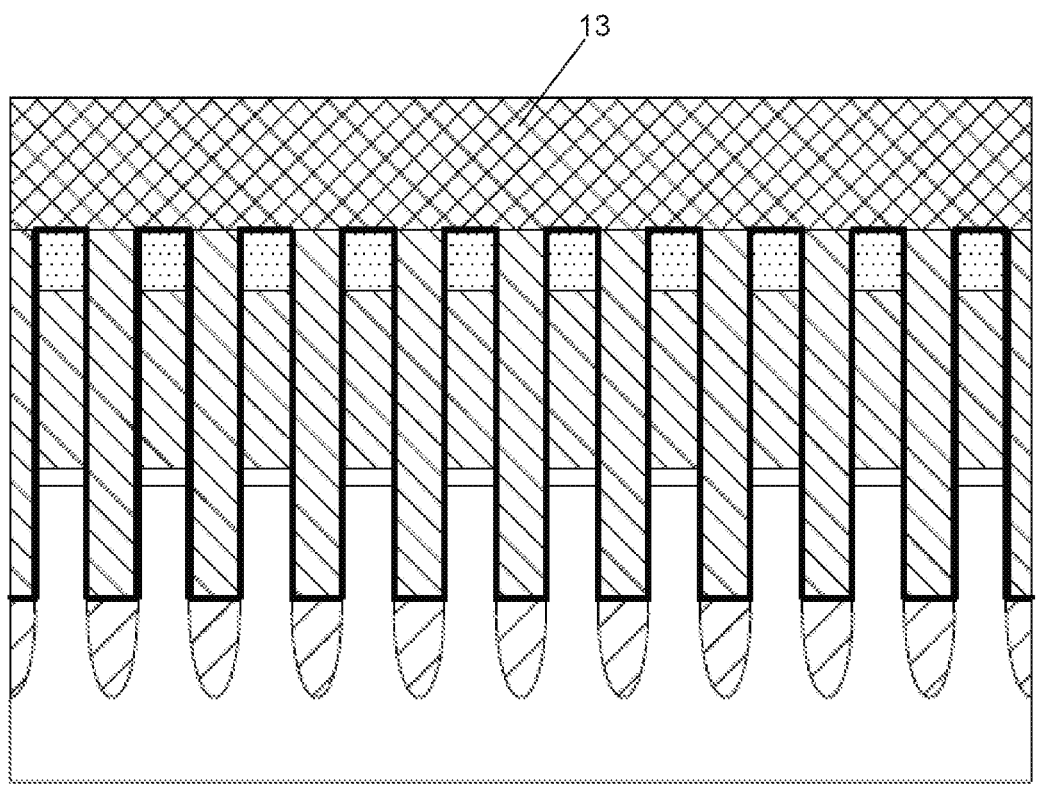
FIG. 1h illustrates the semiconductor device in another stage of the method for producing a gate cut structure on an array of semiconductor fins, according to an example embodiment.
Figure 1I:
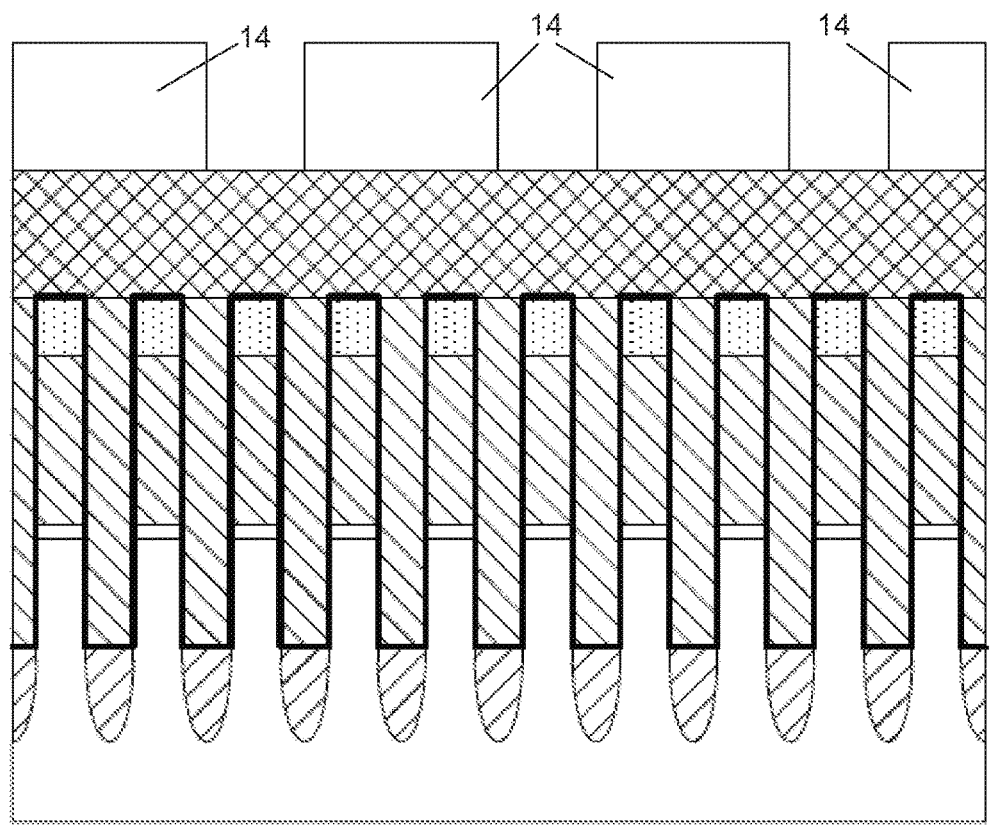
FIG. 1i illustrates the semiconductor device in another stage of the method for producing a gate cut structure on an array of semiconductor fins, according to an example embodiment.
Figure 1J:
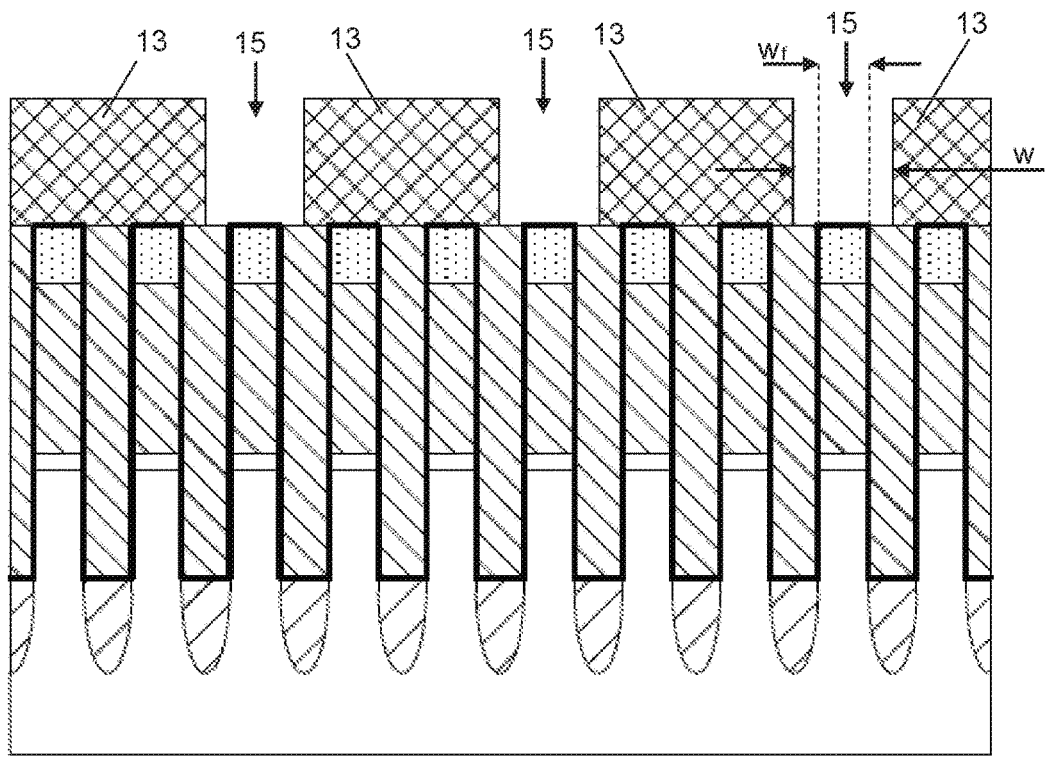
FIG. 1j illustrates the semiconductor device in another stage of the method for producing a gate cut structure on an array of semiconductor fins, according to an example embodiment.

First, as illustrated in FIG. 1b, a shallow trench isolation (STI) oxide 10 is deposited in between and on top of the dual stack fins. The STI 10 may be deposited by Chemical Vapor Deposition (CVD). The parameters of such a deposition are known to a person of ordinary skill in the art and therefore not described here in detail. The STI oxide 10 is planarized (the result of which is shown in FIG. 1*c*) by grinding and/or CMP (chemical mechanical polishing), stopping on the mask 5, and the STI oxide is etched back until the oxide 10 remains in an area at the bottom of the trenches (the result of which is shown in FIG. 1*d*), thereby separating the monocrystalline fin portions 1. Then a dummy silicon oxide layer 11 is deposited conformally on the dual stack fins (the result of which is shown in FIG. 1*e*). The layer 11 may be deposited by Atomic Layer Deposition (ALD), applying ALD parameters known by a person of ordinary skill in the art. Layer 11 covers the side walls of the fins, the top of the fins, and the bottom of the trenches, now formed by the STI oxide 10. Polysilicon is then deposited, such as by low pressure CVD (LPCVD), filling the trenches and forming a layer 12 on top of the dual stack fins (the result of which is shown in FIG. 1*f*). The polySi layer 12 is planarized (the result of which is shown in FIG. 1*g*), stopping on the mask 5. Then a silicon oxide ($SiO_2$) layer 13 is deposited, such as by CVD, on the planarized surface (the result of which is shown in FIG. 1*h*), followed by the production of a patterned hardmask 14 on the $SiO_2$ layer (the result of which is shown in FIG. 1*i*). The hardmask 14 may be a photoresist layer for example. In some example embodiments, the hardmask 14 is a tri-layer stack, for example a PR/SoG/SoC stack formed of photoresist, spin-on glass, and spin-on carbon. The $SiO_2$ layer 13 is then etched, stopping on the planarized surface, and the hardmask 14 is stripped (the result of which is shown in FIG. 1*j*). The hardmask pattern is such that openings 15 are formed above a number of exposed fins, the width w of the openings 15 being superior to the width of the fins $w_f$; and positioned relative to the fins such that the width w of the openings fully overlaps the respective fins. The length of the opening (in the direction perpendicular to the drawings) can be chosen in accordance with a particular design. The use of silicon oxide for the mask 13 can be useful when the mask 5 is formed of $Si_3N_4$, given that $Si_3N_4$ can be removed selectively relative to silicon oxide and to silicon by wet etching with $H_3PO_4$.

Figure 1K:
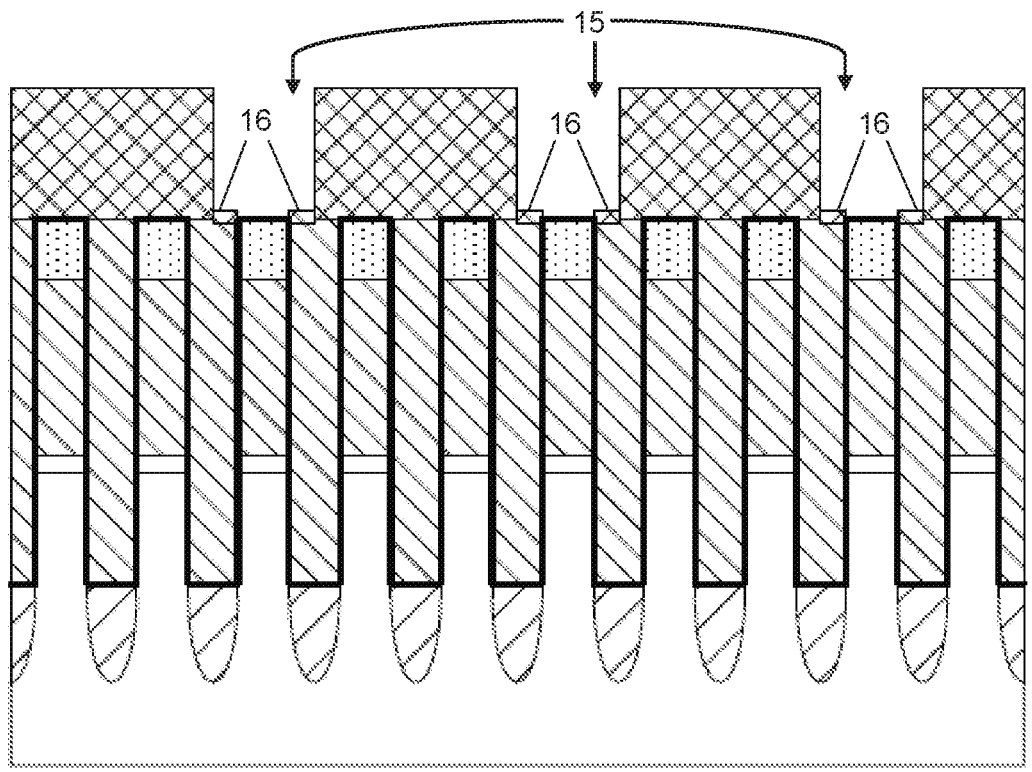
FIG. 1k illustrates the semiconductor device in another stage of the method for producing a gate cut structure on an array of semiconductor fins, according to an example embodiment.

By a heating step, thermal oxidation of the polysilicon on either side of the exposed mask portion 5 in the openings 15 is then obtained, the result of which is shown in FIG. 1*k*. This forms an oxide layer in the shape of two elongate strips 16 of oxide on either side of the exposed fins in each of the openings 15. In some example embodiments, the thickness of the oxide layer is between 2 and 10 nm.

Figure 1L:
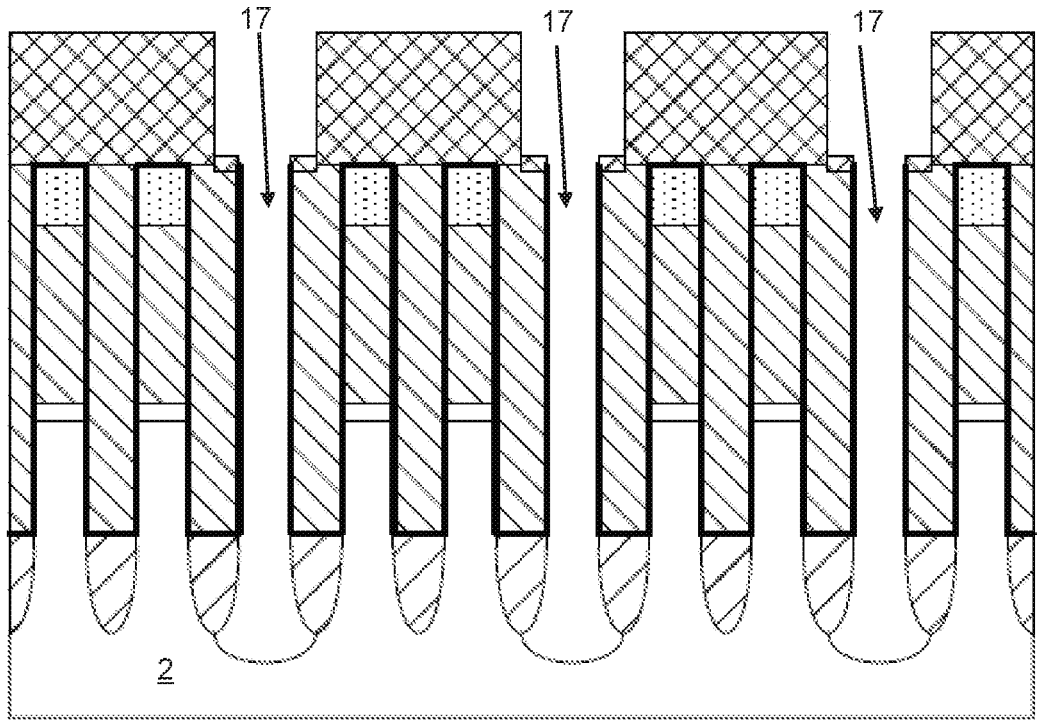
FIG. 1l illustrates the semiconductor device in another stage of the method for producing a gate cut structure on an array of semiconductor fins, according to an example embodiment.

The patterned oxide 13 and the oxide strips 16 are now used as a mask for selectively removing the material of the dual stack fins in the openings (the result of which is shown in FIG. 1*l*). The removal of the fin material occurs in a self-aligned manner, because of the overlapping width w of the opening 15 relative to the width $w_f$ of the fins. In some example embodiments, the etch continues into the silicon substrate 2, as shown in FIG. 1*l*, creating trenches 17. In other examples, the trenches could stop higher up in the monocrystalline fin portion 1. Generally, it can be said that the monocrystalline portion 1 is at least partially removed. Possibly it is completely removed, and possibly the etching continues into the substrate 2, creating trenches 17 with the appearance shown in the drawings.

Figure 1M:
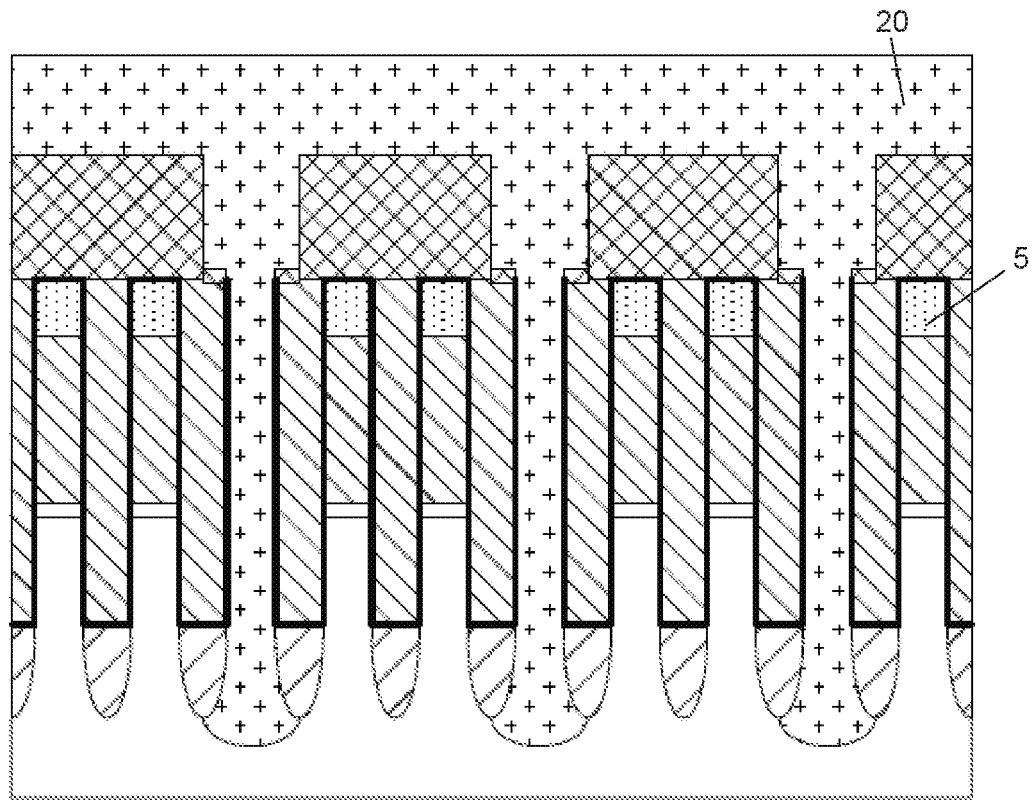
FIG. 1m illustrates the semiconductor device in another stage of the method for producing a gate cut structure on an array of semiconductor fins, according to an example embodiment.
Figure 1N:
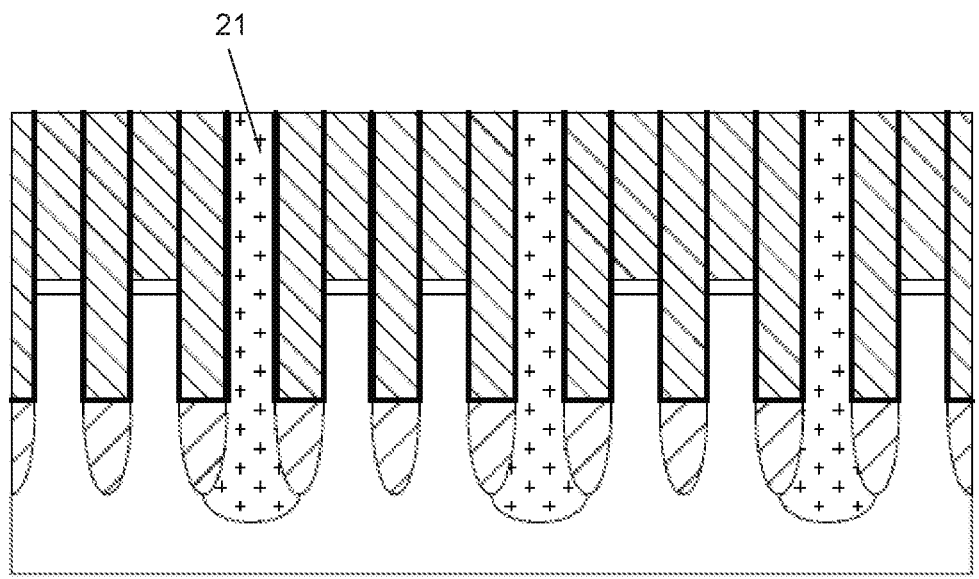
FIG. 1n illustrates the semiconductor device in another stage of the method for producing a gate cut structure on an array of semiconductor fins, according to an example embodiment.
Figure 1O:
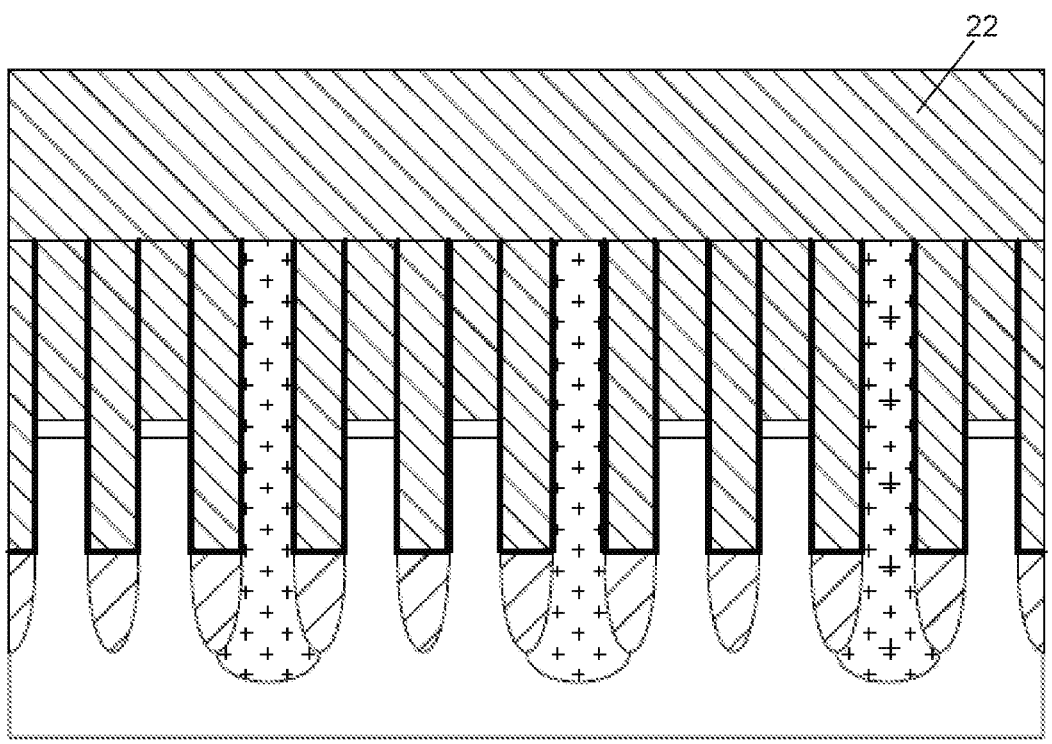
FIG. 1o illustrates the semiconductor device in another stage of the method for producing a gate cut structure on an array of semiconductor fins, according to an example embodiment.

A series of different etch processes may be used to consecutively remove the mask portion 5, the polysilicon portion 4, the thin dielectric portion 3, and the monocrystalline portion 1 of the dual stack fins, as well as a portion of the substrate 2. For example, when the mask 5 and the thin dielectric portion 3 are formed of $Si_3Ni_4$, these portions may be removed by a wet etch process using $H_3PO_4$. The polysilicon 4 and the monocrystalline silicon material 1 and 2 may be removed by tetramethylammoniumhydroxide (TMAH). The trenches 17 formed as a result of the etch processes are then filled with an electrically isolating material 20, the result of which is shown in FIG. 1*m*. This electrically isolating material 20 may be $Si_3N_4$. A sequence of planarization steps may then be applied, until the mask 5 is removed from the remaining fins, thereby creating self-aligned gate cut structures 21 (the result of which is shown in FIG. 1*n*). Finally, a polySi layer 22 is applied (the result of which is shown in FIG. 1O).

The resulting structure can be further used in a known replacement gate process flow for producing transistor devices on the monocrystalline fins 1. The isolating gate cut structures 21 are significantly higher than the monocrystalline fins 1. Therefore, the replacement gate process can be applied without loss of height of the fins. Further, in the method according to the present disclosure, the mask 5 used for creating the fins can remain on the fins until the end of the method.

The present disclosure is also related to intermediate products obtained at particular stages of the method, as shown in FIGS. 1*k*, 1*l*, and 1*m*. This is the substrate comprising the mask 13 and the oxide strips 16 formed on the areas of polySi on either side of the fins in the openings 15.

While the present disclosure has been illustrated and described in detail in the drawings and foregoing description, such illustration and description are to be considered illustrative or exemplary and not restrictive. Other variations to the disclosed embodiments can be understood and effected by those skilled in the art from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specified, the description of a layer being present, deposited, or produced 'on' another layer or substrate, includes the options of: (i) the layer being present, produced, or deposited directly on, i.e., in physical contact with, the other layer or substrate, and (ii) the layer being present, produced, or deposited on one or a stack of intermediate layers between the layer and the other layer or substrate.

What is claimed is:

1. A method for producing a gate cut structure on an array of semiconductor fins, the method comprising:
   providing a substrate comprising an array of dual stack fins, each fin including: (i) a first portion comprising a monocrystalline semiconductor material, (ii) a second portion comprising a polycrystalline semiconductor material on the first portion, and (iii) a third portion comprising a first mask on the second portion;
   depositing a shallow trench isolation (STI) dielectric material in between and on top of the dual stack fins;
   planarizing the STI material, stopping at the third portions of the dual stack fins,
   etching back the STI material beyond a top surface of the first portions of the dual stack fins, thereby forming first trenches between the dual stack fins, the first trenches having the STI material on a bottom thereof;

depositing a conformal dielectric layer on the dual stack fins and on the bottom of the first trenches;

after depositing the conformal dielectric layer, depositing the polycrystalline semiconductor material in the first trenches and on top of the dual stack fins to form a layer of the polycrystalline material;

planarizing the layer of the polycrystalline material, stopping at the third portions of the dual stack fins;

after planarizing the layer of the polycrystalline material, producing a second mask on the planarized surface, the second mask defining at least one opening that exposes a dual stack fin and that extends parallel to the exposed dual stack fin, the opening having a width that exceeds a width of the exposed dual stack fin and that fully overlaps the width of the exposed dual stack fin;

heating the substrate, thereby forming two oxide strips formed of thermally oxidized polycrystalline semiconductor material at a bottom of the at least one opening, the oxide strips being positioned on either side of the third portion of the exposed dual stack fin;

after forming the oxide strips, removing the third portion, the second portion, and at least part of the first portion of the exposed dual stack fin by performing a self-aligned etching process in the opening, thereby creating a second trench; and filling the second trench with an electrically isolating material, thereby forming the gate cut structure.

2. The method according to claim 1, further comprising: planarizing the electrically isolating material, the second mask, the oxide strips, and any remaining third portions of the dual stack fins, stopping at the second portions of the dual stack fins.

3. The method according to claim 2, further comprising: after planarizing the electrically isolating material, the second mask, the oxide strips, and any remaining third portions of the dual stack fins, depositing the polycrystalline semiconductor material on the planarized surface.

4. The method according to claim 1, wherein the dual stack fins further comprise a dielectric portion in between the first portion and the second portion, and wherein the dielectric portion is removed when creating the second trench.

5. The method according to claim 1, wherein the monocrystalline semiconductor material is monocrystalline silicon and the polycrystalline semiconductor material is polycrystalline silicon.

6. The method according to claim 1, wherein the third portion of the dual stack fins is formed of $Si_3N_4$.

7. The method according to claim 1, wherein the second mask is formed of an oxide material.

8. The method according to claim 7, wherein the oxide material comprises silicon oxide.

9. A semiconductor substrate comprising on its surface:

an array of dual stack fins, each fin including: (i) a first portion comprising a monocrystalline semiconductor material, (ii) a second portion comprising a polycrystalline semiconductor material on the first portion, and (iii) a third portion comprising a first mask on the second portion;

trenches in between the dual stack fins, the trenches having (i) a shallow trench isolation (STI) material at a bottom of the trenches, (ii) a conformal dielectric layer on sidewalls of the dual stack fins and on the STI material at the bottom of the trenches, and (iii) the polycrystalline semiconductor material inside the trenches, wherein the substrate is planarized at a level of the third portions of the dual stack fins;

a second mask on the planarized surface, the second mask defining at least one opening that exposes a dual stack fin and that extends parallel to the exposed dual stack fin, the opening having a width that exceeds a width of the exposed dual stack fin and that fully overlaps the width of the exposed dual stack fin; and two strips formed of an oxide of the polycrystalline semiconductor material at a bottom of the at least one opening, the strips being positioned on either side of the third portion of the exposed dual stack fin.

10. The semiconductor substrate according to claim 9, wherein the dual stack fins further comprise a dielectric portion in between the first portion and the second portion.

11. The semiconductor substrate according to claim 9, wherein the monocrystalline semiconductor material is monocrystalline silicon and the polycrystalline semiconductor material is polycrystalline silicon.

12. The semiconductor substrate according to claim 9, wherein the third portion of the dual stack fins is formed of $Si_3N_4$.

13. The semiconductor substrate according to claim 9, wherein the second mask is formed of an oxide material.

14. The semiconductor substrate according to claim 13, wherein the oxide material comprises silicon oxide.

15. A semiconductor substrate comprising on its surface:

an array of dual stack fins, each fin including: (i) a first portion comprising a monocrystalline semiconductor material, (ii) a second portion comprising a polycrystalline semiconductor material on the first portion, and (iii) a third portion comprising a first mask on the second portion;

first trenches in between the dual stack fins, the first trenches having (i) a shallow trench isolation (STI) material at a bottom of the first trenches, (ii) a conformal dielectric layer on sidewalls of the dual stack fins and on the STI material at the bottom of the first trenches, and (iii) the polycrystalline semiconductor material inside the first trenches, wherein the substrate is planarized at a level of the third portions of the dual stack fins; and a second mask and oxide strips formed of an oxide of the polycrystalline semiconductor material on the planarized surface, the second mask and the oxide strips defining at least one opening that exposes a second trench, wherein the second trench is formed by performing a self-aligned etching process in the opening to remove the third portion, the second portion, and at least part of the first portion of one of the dual stack fins.

16. The semiconductor substrate according to claim 15, wherein the second trench is filled with an electrically isolating material.

17. The semiconductor substrate according to claim 16, wherein the electrically isolating material comprises $Si_3N_4$.

18. The semiconductor substrate according to claim 15, wherein the dual stack fins further comprise a dielectric portion in between the first portion and the second portion.

19. The semiconductor substrate according to claim 15, wherein the monocrystalline semiconductor material is monocrystalline silicon and the polycrystalline semiconductor material is polycrystalline silicon.

20. The semiconductor substrate according to claim 15, wherein the third portion of the dual stack fins is formed of $Si_3N_4$.

* * * * *